(12) United States Patent
Ban et al.

(10) Patent No.: US 11,871,645 B2
(45) Date of Patent: Jan. 9, 2024

(54) DISPLAY SUBSTRATE, DISPLAY DEVICE AND MANUFACTURING METHOD OF DISPLAY SUBSTRATE

(71) Applicant: BOE TECHNOLOGY GROUP CO., LTD., Beijing (CN)

(72) Inventors: Shengguang Ban, Beijing (CN); Shuilang Dong, Beijing (CN); Qingzhao Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 546 days.

(21) Appl. No.: 17/255,293

(22) PCT Filed: May 26, 2020

(86) PCT No.: PCT/CN2020/092239
§ 371 (c)(1),
(2) Date: Dec. 22, 2020

(87) PCT Pub. No.: WO2021/008239
PCT Pub. Date: Jan. 21, 2021

(65) Prior Publication Data
US 2021/0175448 A1 Jun. 10, 2021

(30) Foreign Application Priority Data

Jul. 17, 2019 (CN) .......................... 201910644649.X

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 71/00* (2023.02); *H10K 59/1201* (2023.02); *H10K 2102/311* (2023.02)

(58) Field of Classification Search
CPC .... H10K 77/111; H10K 59/131; H10K 71/00; H10K 59/1201; H10K 2102/311; H10K 59/12
See application file for complete search history.

(56) References Cited

U.S. PATENT DOCUMENTS

| 9,306,180 B2 | 4/2016 | Kim |
| 10,168,813 B2 | 1/2019 | Jeong |

(Continued)

FOREIGN PATENT DOCUMENTS

| CN | 105514139 A | 4/2016 |
| CN | 108008866 A | 5/2018 |

(Continued)

*Primary Examiner* — Dao H Nguyen
(74) *Attorney, Agent, or Firm* — The Webb Law Firm

(57) ABSTRACT

The present disclosure relates to a display substrate, a display device and a manufacturing method of the display substrate. The display substrate includes: a stretchable base including a plurality of opening patterns distributed along a surface of the stretchable base, wherein each of the plurality of opening patterns includes a plurality of opening areas, a plurality of bridge areas configured to enclose a first island area are formed between adjacent opening areas among the plurality of opening areas, and each of the plurality of opening patterns is configured to enclose a plurality of second island areas with at least two adjacent opening patterns; a plurality of display units respectively arranged on the first island area and the plurality of second island areas; and a plurality of signal lines respectively connected between the plurality of display units and respectively arranged in the plurality of bridge areas.

20 Claims, 11 Drawing Sheets

(51) Int. Cl.
*H10K 71/00* (2023.01)
*H10K 59/12* (2023.01)
*H10K 102/00* (2023.01)

(56) References Cited

U.S. PATENT DOCUMENTS

| | | | |
|---|---|---|---|
| 10,211,273 | B2 | 2/2019 | Lee et al. |
| 10,684,716 | B2 | 6/2020 | Zhai |
| 2016/0111481 | A1 | 4/2016 | Jeong et al. |
| 2018/0052493 | A1 | 2/2018 | Hong et al. |
| 2018/0120998 | A1 | 5/2018 | Jeong |
| 2019/0280077 | A1* | 9/2019 | Park .................. H10K 59/131 |
| 2019/0341433 | A1* | 11/2019 | Im ..................... H10K 59/131 |
| 2020/0105170 | A1 | 4/2020 | Dai et al. |
| 2020/0168824 | A1* | 5/2020 | Park .................. H10K 77/111 |
| 2021/0104579 | A1* | 4/2021 | Zhang ............... H10K 77/111 |
| 2021/0143243 | A1 | 5/2021 | Ban |
| 2021/0208446 | A1* | 7/2021 | Yang ................ G02F 1/133345 |
| 2022/0344612 | A1* | 10/2022 | Jia .................... H10K 77/111 |

FOREIGN PATENT DOCUMENTS

| | | |
|---|---|---|
| CN | 109036145 A | 12/2018 |
| CN | 109064900 A | 12/2018 |
| CN | 109189265 A | 1/2019 |
| CN | 109308851 A | 2/2019 |
| CN | 109686253 A | 4/2019 |
| CN | 109830504 A | 5/2019 |
| CN | 109841660 A | 6/2019 |
| CN | 109920334 A | 6/2019 |
| CN | 109920803 A | 6/2019 |
| CN | 109935730 A | 6/2019 |
| CN | 110350014 A | 10/2019 |

\* cited by examiner

DISPLAY SUBSTRATE, DISPLAY DEVICE AND MANUFACTURING METHOD OF DISPLAY SUBSTRATE

CROSS-REFERENCE TO RELATED APPLICATIONS

The present application is a U.S. National Stage Application under 35 U.S.C. § 371 of International Patent Application No. PCT/CN2019/092239, filed on May 26, 2020, which is based on and claims priority to CN Patent Application No. 201910644649.X filed on Jul. 17, 2019, the disclosure of which is incorporated by reference herein in its entirety.

TECHNICAL FIELD

The present disclosure relates to a display substrate, a display device and a manufacturing method of the display substrate.

BACKGROUND

With the development of display technology, the organic light-emitting diode (referred to as OLEDs for short) capable of a flexible display enhances a diversified display and gradually becomes the mainstream of display technology. In some related technologies, the OLED flexible display device can implement folding of a two-dimensional surface, but is not adapted for flexible display requirements in more complicated circumstances (such as wearable and the like). In order to develop the display function of a stretchable OLED display, in the OLED flexible display devices of some related technologies, a base material is bored to form islands for preparing pixel areas and bridges for wiring, and implement stretching the display device by deformation of the bridges.

SUMMARY

In one aspect of the present disclosure, a display substrate is provided. The display substrate includes: a stretchable base including a plurality of opening patterns distributed along a surface of the stretchable base, wherein each of the plurality of opening patterns includes a plurality of opening areas, a plurality of bridge areas configured to enclose a first island area are formed between adjacent opening areas among the plurality of opening areas, and each of the plurality of opening patterns is configured to enclose a plurality of second island areas with at least two adjacent opening patterns; a plurality of display units respectively arranged on the first island area and the plurality of second island areas; and a plurality of signal lines respectively connected between the plurality of display units and respectively arranged in the plurality of bridge areas.

In some embodiments, each of at least two among the plurality of opening areas includes elongated hole sections, and an elongated bridge area is formed between elongated hole sections of adjacent opening areas.

In some embodiments, the elongated hole sections of adjacent opening areas are parallel to each other.

In some embodiments, the elongated bridge areas located on both opposite sides of the first island area are parallel to each other.

In some embodiments, the elongated bridge areas located on both adjacent sides of the first island area are perpendicular to each other.

In some embodiments, the plurality of opening patterns are sequentially arranged along a first direction and a second direction orthogonal to each other, part of bridge areas in two adjacent opening patterns along the first direction among the plurality of opening patterns are staggered with each other, and partially overlap in orthographic projections on a first reference line extending along the first direction, and part of bridge areas in two adjacent opening patterns along the second direction among the plurality of opening patterns are staggered with each other, and partially overlap in orthographic projections on a second reference line extending along the second direction.

In some embodiments, part of opening patterns among the plurality of opening patterns include an opening area configured to form a bridge area with an opening area in an adjacent opening pattern.

In some embodiments, each of the plurality of opening areas presents one of a T-shape and an I-shape.

In some embodiments, the plurality of opening areas include: four T-shaped opening areas, each of which includes one first elongated hole section and one second elongated hole section communicating with a non-end portion of the first elongated hole section; and wherein first elongated hole sections of respective T-shaped opening areas are respectively located around the first island area and sequentially rotate 90 degrees around the first island area, and second elongated hole sections of respective T-shaped opening areas are respectively located around the first island area, rotate 90 degrees around the first island area, and form a bridge area with the first elongated hole sections in adjacent T-shaped opening areas in a same clockwise direction around the first island area.

In some embodiments, the first elongated hole section and the second elongated hole section are both straight linear hole sections, and the first elongated hole section and the second elongated hole section are perpendicular to each other.

In some embodiments, the first island area has a square shape with a side length of 250-350 μm, the bridge area has a width of 60-100 μm, the second elongated hole section has a length of 800-900 μm, the first elongated hole section has a length of 500~600 μm, the first elongated hole section and the second elongated hole section both have a width of 15-25 μm, and the shortest distance between first elongated hole sections of adjacent T-shaped opening areas in the same clockwise direction around the first island area is 60-100 μm.

In some embodiments, the first elongated hole section is an arc-shaped hole section, a width of a middle portion of the arc-shaped hole section is 1.5 to 2 times widths of both ends of the arc-shaped hole section respectively, and a circle center of the arc-shaped hole section is located on one side away from the second elongated hole section; the second elongated hole section is a drum-shaped hole section, and a width of the middle of the drum-shaped hole section is 2 to 3 times widths of both ends of the drum-shaped hole section respectively.

In some embodiments, the plurality of opening areas include: four I-shaped opening areas, wherein each of the four I-shaped opening areas includes one first elongated hole section, one third elongated hole section that does not intersect with the first elongated hole section, and one second elongated hole section located between the first elongated hole section and the third elongated hole section, and communicating with non-end portions of the first elongated hole section and the third elongated hole section respectively, and wherein first elongated hole sections of respective I-shaped opening areas are respectively located around the first island area and sequentially rotate 90 degrees around the first island area; second elongated hole sections of respective I-shaped opening areas are respectively located around the first island area, sequentially rotate 90 degrees around the first island area, and form a bridge area with the first elongated hole sections in adjacent I-shaped opening areas in a same clockwise direction around the first island area; and the third elongated hole sections of respective I-shaped opening areas form bridge areas with opening areas in adjacent opening patterns.

In some embodiments, the first elongated hole section, the second elongated hole section and the third elongated hole section are all straight linear hole sections, and the first elongated hole section and the third elongated hole section are parallel to each other, and are both perpendicular to the second elongated hole section.

In some embodiments, the first elongated hole section and the third elongated hole section are both arc-shaped hole sections, and a width of a middle portion of the arc-shaped hole section is 1.5~2 times widths of both ends of the arc-shaped hole section respectively, and a circle center of the arc-shaped hole section is located on one side away from the second elongated hole section; the second elongated hole section is a drum-shaped hole section, and a widths of a middle portion of the drum-shaped hole section is 2~3 times widths of both ends of the drum-shaped hole section respectively.

In some embodiments, the stretchable base includes a plurality of stretchable display areas formed by the plurality of opening patterns and sequentially distributed along the first direction and the second direction, and each stretchable display area includes the first island area and three second island areas, wherein: the first island area is surrounded by a plurality of bridge areas in a first opening pattern among the plurality of opening patterns; the first of the three second island areas is enclosed by part of bridge areas of the first opening pattern and part of bridge areas of the second opening pattern among the plurality of opening patterns that is adjacent to the first opening pattern along the first direction; the second of the three second island areas is enclosed by part of bridge areas of the first opening pattern and part of bridge areas of the third opening pattern among the plurality of opening patterns that is adjacent to the first opening pattern along the second direction; the third of the three second island areas is enclosed by part of bridge areas of the first opening pattern, part of bridge areas of the second opening pattern, part of bridge areas of the third opening pattern and part of bridge areas of the fourth opening pattern among the plurality of opening patterns that is both adjacent to the second opening pattern and the third opening pattern.

In some embodiments, each of the plurality of stretchable display areas has substantially equal Young's modulus.

In some embodiments, each of the plurality of display units includes an organic light emitting diode or a quantum dot light emitting diode.

In another aspect of the present disclosure, a manufacturing method of a display substrate is provided. The method includes the steps of: providing a stretchable base; forming a plurality of opening patterns on a surface of the stretchable base, wherein each of the plurality of opening patterns includes a plurality of opening areas, a plurality of bridge areas configured to enclose a first island area are formed between adjacent opening areas among the plurality of opening areas, and each of the plurality of opening patterns is configured to enclose a plurality of second island areas with at least two adjacent opening patterns; forming a plurality of display units on the first island area and the plurality of second island areas, and forming a plurality of signal lines respectively connected to the plurality of display units in the plurality of bridge areas.

In one aspect of the present disclosure, a display device is provided. The display device includes: the display substrate as described previously.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
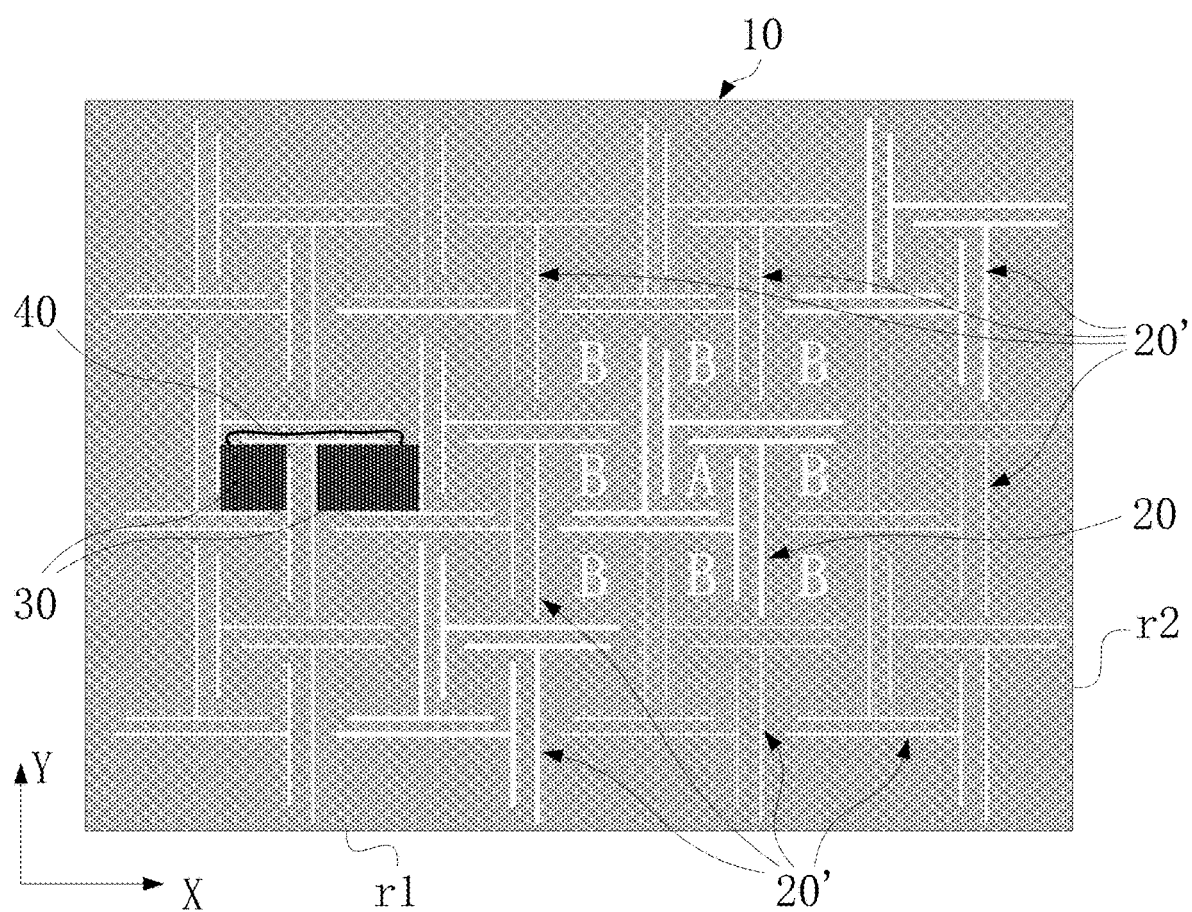
FIG. 1 is a schematic structural view of an embodiment of the display substrate according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words "first", "second", and similar words used in the present disclosure do not denote any order, quantity or importance, but merely serve to distinguish different parts. Such similar words as "comprising" or "including" mean that the element preceding the word encompasses the elements enumerated after the word, and does not exclude the possibility of encompassing other elements as well. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the OLED flexible display devices of some related technologies, a base material is bored to form islands for preparing pixel areas and bridges for wiring, and implement stretching the display device by deformation of the bridges. When stretching is simulated in such solution of realizing the stretchability of the display device by boring, the tensile force is mainly borne by the bridge area, so that it is easily that there is a phenomenon of stress concentration. The concentration of a tensile stress borne in the inner side of the bridge area might result in that a central area of the bridge area is easily fractured, and the display device needs to be improved in indices such as a theoretical pixel density (Pixel Per Inch, referred to as PPI for short) or a maximum stretching amount.

In view of this, the embodiments of the present disclosure provide a display substrate, a display device, and a manufacturing method of the display substrate, which can improve the stretching performance.

Figures 2, 3:
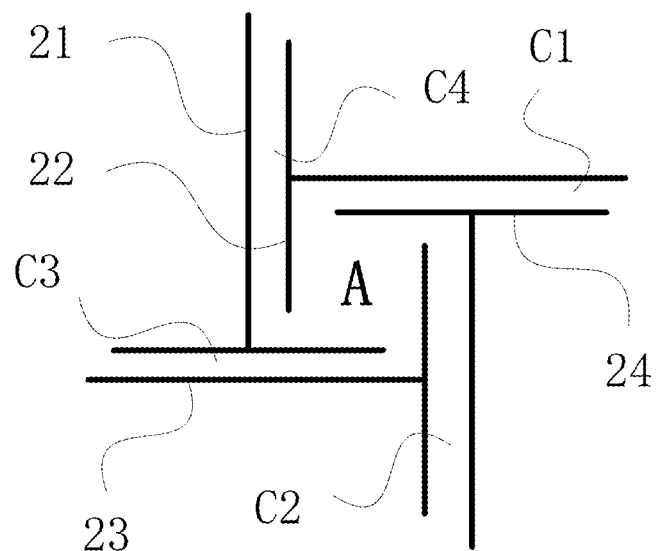
FIG. 2 is a schematic view of an example of one opening pattern in the embodiment of FIG. 1.
FIGS. 3 (a)-(d) are schematic views of four types of opening areas that constitute the example of the opening pattern in FIG. 2 respectively.
Figure 4:
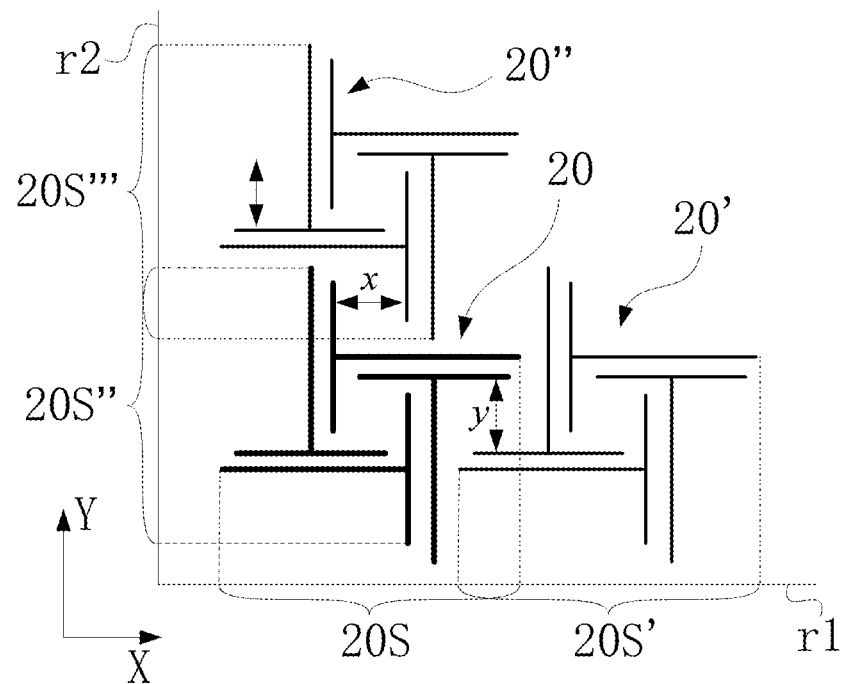
FIG. 4 is a schematic view of three adjacent opening patterns in the embodiment of FIG. 1.

FIG. 1 is a schematic structural view of an embodiment of the display substrate according to the present disclosure. FIG. 2 is a schematic view of an example of one opening pattern in the embodiment of FIG. 1. FIGS. 3 (a)-(d) are schematic views of four types of opening areas that constitute the example of the opening pattern in FIG. 2. FIG. 4 is a schematic view of three adjacent opening patterns in the embodiment of FIG. 1.

Referring to FIG. 1, In some embodiments, the display substrate includes a stretchable base 10, a plurality of display units 30 and a plurality of signal lines 40. The stretchable base 10 may be a base material with an elastic stretching property, such as polyimide (PI for short). The stretchable base 10 may include a plurality of opening patterns distributed along a surface of the stretchable base 10.

Referring to FIG. 1, for ease of understanding, the stretchable base 10 is in the form of filling a solid material portion with dark fine particles, and reflects an opening pattern formed in the base by a solid white line. FIG. 1 also shows positions of two adjacent display units 30 relative to the opening pattern, and a connection manner between the display units 30 through the signal line 40 in local positions of FIG. 1. In order to further display the characteristics of the opening pattern, in other accompanying drawings of the specification after FIG. 1, a black solid line is used to reflect an opening area in the opening pattern.

In some embodiments, the display unit 30 may include an organic light-emitting diode (referred to as OLED for short). In other embodiments, the display unit 30 may include, for example, an inorganic light emitting diode (referred to as LED for short) or a quantum dot light emitting diode (referred to as QLED for short), and the like.

In some embodiments, each of the plurality of opening patterns includes a plurality of opening areas. The opening area refers to an interiorly continuous and uninterrupted opening. In FIG. 1, for each opening pattern, a plurality of bridge areas capable of enclosing a first island area A are formed between adjacent opening areas among the plurality of opening areas included therein. For the plurality of opening patterns, each opening pattern can enclose a plurality of second island areas B with other opening patterns (for example, at least two adjacent opening patterns). For ease of understanding, in FIG. 1, a certain opening pattern 20 displayed by bolding is taken as an example, and surrounded by eight adjacent opening patterns 20' represented by lines of different thicknesses. Lines of different thicknesses are used to distinguish different adjacent opening patterns, and actually different opening patterns may include grooves having the same width. The bridge area, the first island area, and the second island area are all solid material portions of the stretchable base.

Referring to FIG. 1, a plurality of display units 30 may be arranged on the first island area A and the plurality of second island areas B respectively. A plurality of signal lines 40 are respectively arranged in a plurality of bridge areas and configured to connect adjacent display units 30. The signal lines 40 may be arranged along a length direction of the bridge area and connected to thin film transistors (referred to as TFT for short) of adjacent display units 30. The signal lines 40 may be arranged on a surface or inside the bridge area, and may be formed of a conductive material, such as a metal wire, a nanotube, a nanowire, or a conductive trace.

In this embodiment, when the display substrate is stretched, both the bridge areas and the island areas thereof bear a tensile force and are deformed, which may avoid concentration of tensile stress in the bridge areas, so that the bridge areas are not easily fractured. In addition, the island areas enclosed by the bridge areas have a relatively large area, and the area of the display area of the display unit provided thereon may have an increased area accordingly, thereby facilitating improving the PPI.

Referring to FIG. 2, in some embodiments, at least two of the opening areas among the plurality of opening areas include elongated hole sections, and elongated bridge areas are formed between the elongated hole sections of adjacent opening areas. Compared with the opening areas of other shapes, the elongated hole sections occupy a smaller proportion of area in the base, and elongated bridge areas may be conveniently formed between the elongated hole sections of adjacent opening areas. The island area enclosed by the elongated bridge areas has an higher area ratio to the area of the base, so that it is possible to further increase an area of the display area of the display unit provided on the island area, thereby further improving the PPI.

In FIG. 2, the opening pattern includes the first opening area 21 shown in FIG. 3 (a), the second opening area 22 shown in FIG. 3 (b), and the third opening area 23 shown in FIG. 3 (c) and the fourth opening area 24 shown in FIG. 3 (d). Here, the opening areas in the opening pattern are all T-shaped opening areas. Each T-shaped opening area includes a first elongated hole section 2a and a second elongated hole section 2b communicating with a non-end portion of the first elongated hole section 2a.

The communication position between the second elongated hole section 2b and the first elongated hole section 2a is not at any one end of the first elongated hole section 2a, but at a certain position between both ends. In some embodiments, one end of the second elongated hole section 2b is connected to the midpoint of the first elongated hole section 2a, which facilitates forming a more regular opening pattern. In other embodiments, one end of the second elongated hole section 2b may also communicate with other positions of the first elongated hole section 2a.

The first elongated hole sections 2a of respective T-shaped opening areas are respectively located around the first island area A, and arranged by sequentially rotating 90 degrees around the first island area. The second elongated hole sections 2b of respective T-shaped opening areas are also respectively located around the first island area A, and form a bridge area with the first elongated hole sections 2a in the adjacent T-shaped opening area in the same clockwise direction around the first island area A by sequentially rotating 90 degrees around the first island area.

In FIG. 2, along the clockwise direction, a bridge area C4 is formed between the second elongated hole section 2b of the first opening area 21 and the first elongated hole section 2a of the second opening area 22, a bridge area C1 is formed between the second elongated hole section 2b of the second opening area 22 and the first elongated hole section 2a of the fourth opening area 24, a bridge area C2 is formed between the second elongated hole section 2b of the fourth opening area 24 and the first elongated hole section 2a of the third opening area 23, and a bridge area C3 is formed between the second elongated hole section 2b of the third opening area 23 and the first elongated hole section 2a of the first opening area 21. By way of the clockwise arrangement of the above-described four opening areas, four bridge areas and a first island area surrounded by the four bridge areas are formed.

In other embodiments, the opening pattern may also be replaced with an arrangement manner along the counter-clockwise direction, that is, an opening pattern obtained by mirroring the opening pattern in FIG. 2 in the horizontal or vertical direction.

Referring to FIGS. 3 (a)-(d), in some embodiments, the first elongated hole section 2a and the second elongated hole section 2b in the T-shaped opening area are optionally straight linear hole sections, and the first elongated hole section 2a and the second elongated hole section 2b are perpendicular to each other. This T-shaped opening area facilitates forming bridge areas and island areas in regular shapes, which is convenient for design and machining. In other embodiments, at least one of the first elongated hole section and the second elongated hole section in the T-shaped opening area may also be an arc-shaped hole section or a polyline-shaped hole section.

Referring to FIG. 2, in some embodiments, the elongated hole sections of adjacent opening areas are parallel to each other. For example, a bridge area C4 having an equal width may be formed between the second elongated hole section 2b of the first opening area 21 and the first elongated hole section 2a of the second opening area 22 in FIG. 2, which facilitates a more balanced tensile stress at each position of the bridge area when the display substrate is stretched, and avoiding damage due to an excessive local tensile stress.

In some embodiments, the elongated bridge areas located on two opposite sides of the first island area A may also be parallel to each other. For example, in FIG. 2, the bridge area C4 and the bridge area C2 transversely opposite to each other are parallel to each other, and the bridge area C1 and the bridge area C3 longitudinally opposite to each other are parallel to each other. This facilitates obtaining the first island area and the second island area in more regular shapes, so that on one hand, it is possible that there is a more balanced tensile stress at each position of the island area and the bridge area when the display substrate is stretched, and on the other hand, it is also convenient for the design and machining of the opening pattern as well as the formation of the display unit.

The first direction X and the second direction Y orthogonal to each other are identified in the lower left corner of FIG. 1. In some embodiments, the plurality of opening patterns included in the stretchable base may be sequentially arranged along the first direction X and the second direction Y orthogonal to each other. Moreover, referring to FIGS. 1 and 4, in some embodiments, part of the bridge areas in two adjacent opening patterns along the first direction X among the plurality of opening patterns are staggered with each other, and partially overlap in the orthographic projections on the first reference line r1 extending along the first direction X. Part of the bridge areas in two adjacent opening patterns along the second direction Y among the plurality of opening patterns are staggered with each other, and partially overlap in the orthographic projections on the second reference line r2 extending along the second direction Y. The first reference line r1 and the second reference line r2 may be implemented by randomly providing virtual straight lines according to the first direction X and the second direction Y respectively.

Taking the opening pattern 20, the opening pattern 20' adjacent to the opening pattern 20 in the first direction X, and the opening pattern 20" adjacent to the opening pattern 20 in the second direction Y in FIG. 4 as an example, it may be seen that there is an overlapped portion between the orthographic projection 20S of the opening pattern 20 on the first reference line r1 and the orthographic projection 20S' of the opening pattern 20' on the first reference line r1, while there is an overlapped portion between the orthographic projection 20S″ of the opening pattern 20 on the second reference line r2″ and the orthographic projection 20S‴ of the opening pattern 20‴ on the second reference line r2. Moreover, referring to FIGS. 2 and 4, the opening pattern 20 has the bridge area C1 to the right which is staggered with the bridge area C3 of the adjacent opening pattern 20′ by a length y in the second direction Y, and has the bridge area C4 to the upper which is staggered with the bridge area C2 of the opening pattern 20″ adjacent thereto by a length x in the first direction X.

Part of bridge areas of two adjacent opening patterns are staggered with each other and partially overlap in the orthographic projections on the first reference line r1, so that the bridge areas of two adjacent opening patterns may enclose a second island area B therebetween. In addition, referring to FIG. 2, in some embodiments, the elongated bridge areas located on both adjacent sides of the first island area A may also be perpendicular to each other. In this way, a first island area and a second island area in a rectangular or square shape may be formed, so that there is a more balanced tensile stress at each position of the island area and the bridge area when the display substrate is stretched, and at the same time it is also convenient for the design and machining of the opening pattern and the formation of the display unit.

Figure 5:
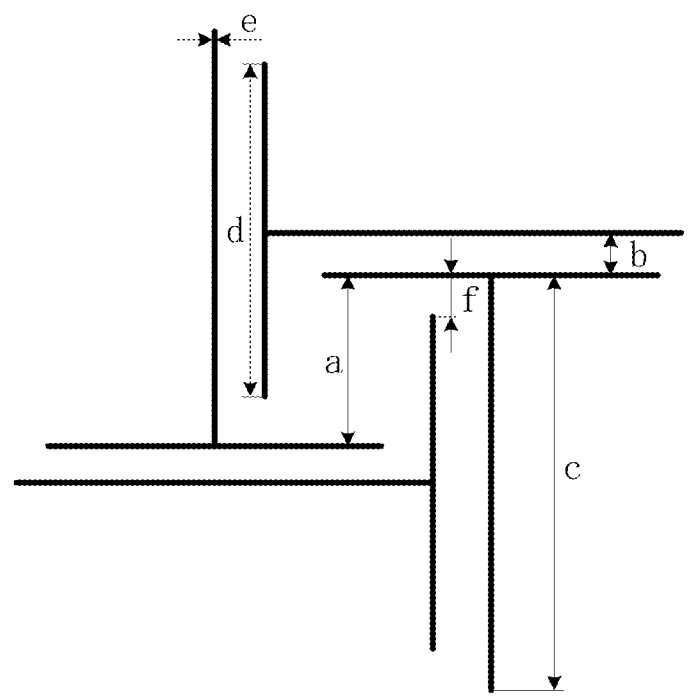
FIG. 5 is a schematic view of multiple sizes in the opening pattern in FIG. 2.
Figure 6:
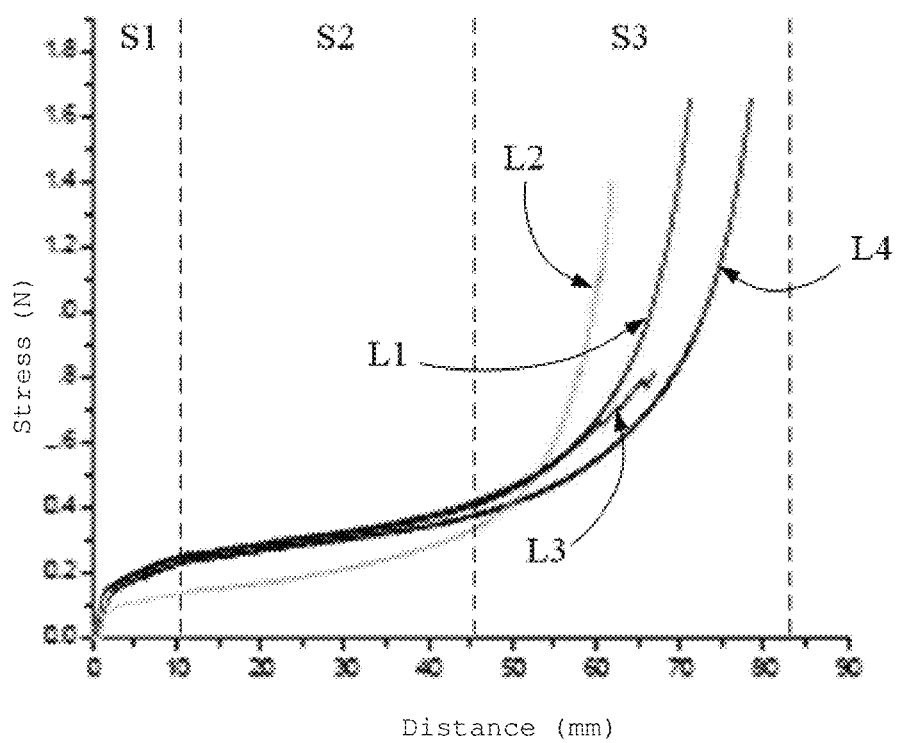
FIG. 6 is a schematic view of a tensile characteristic curve corresponding to the examples of the opening pattern of four different parameter combinations in FIG. 5.

FIG. 5 is a schematic view of multiple sizes in the opening pattern in FIG. 2. FIG. 6 is a schematic view of a tensile characteristic curve corresponding to the examples of the opening pattern of four different parameter combinations in FIG. 5.

Referring to FIG. 5, in some embodiments, four T-shaped opening areas enclose a first island area in a square shape. The first elongated hole section and the second elongated hole section of each T-shaped opening area are perpendicular to each other, and the four T-shaped opening areas form four bridge areas in the four directions of the first island area. Here, it is defined that the side length of the first island area is a, the width of the bridge area is b, the length of the second elongated hole section is c, the length of the first elongated hole section is d, the widths of the first elongated hole section and the second elongated hole section are both e, and the shortest distance between the first elongated hole sections of adjacent T-shaped opening areas in the same clockwise direction around the first island area is f.

According to the experiment, the optional range of each parameter of the opening pattern in FIG. 5 consists in that: the value of a is 250~600 μm, the value of b is 60~190 μm, the value of c is 800~1600 μm, the value of d is 500~1200 μm, the value of e is 15~50 μm, and the value of f is 40~300 μm. Based on the above-described optional range, four examples are provided below:

Example I: the value of a is 250~350 μm, the value of b is 60~100 μm, the value of c is 800~900 μm, the value of d is 500~600 μm, the value of e is 15~25 μm, and the value of f is 60~100 μm;

Example II: the value of a is 400~600 μm, the value of b is 130~190 μm, the value of c is 1400~1600 μm, the value of d is 1100~1200 μm, the value of e is 30~50 μm, and the value of f is 130~190 μm;

Example III: the value of a is 250~350 μm, the value of b is 60~100 μm, the value of c is 800~900 μm, the value of d is 500~600 μm, the value of e is 15~25 μm, and the value of f is 130~190 μm;

Example IV: the value of a is 400~600 μm, the value of b is 130~190 μm, the value of c is 1400~1600 μm, the value of d is 1100~1200 μm, the value of e is 30~50 μm, and the value of f is 200~300 μm.

The four curves L1 to L4 in FIG. 6 represent the tensile characteristics of Example I to Example IV, that is, a variation condition in the stress of the display substrate when it is gradually stretched. In FIG. 6, three areas are divided by two dashed lines according to a stretched distance, i.e., a stress lift area S1, a linear stress strain area S2 and a nonlinear stress strain area S3. From the four curves in FIG. 6, four curves all may achieve a favorable tensile property.

For a stretchable display substrate, its area used mainly is the linear stress-strain area S2. Among the four curves, the curves L1, L3, and L4 have a greater tensile rigidity than curve L2, and the values of respective parameters in the opening pattern corresponding to the curve L1 are smaller, and are more easily to achieve a high pixel density as compared to the curves L3 and L4. Therefore, taking the example I as a preferred solution, that is, it is preferable that the side length of the first island area is 250~350 μm, the width of the bridge area is 60~100 μm, the length of the second elongated hole section is 800~900 μm, the length of the first elongated hole section is 500~600 μm, the widths of the first elongated hole section and the second elongated hole section are both 15-25 μm, and the shortest distance between the first elongated hole sections of adjacent T-shaped opening areas in the same clockwise direction around the first island area is 60-100 μm.

Figure 7:
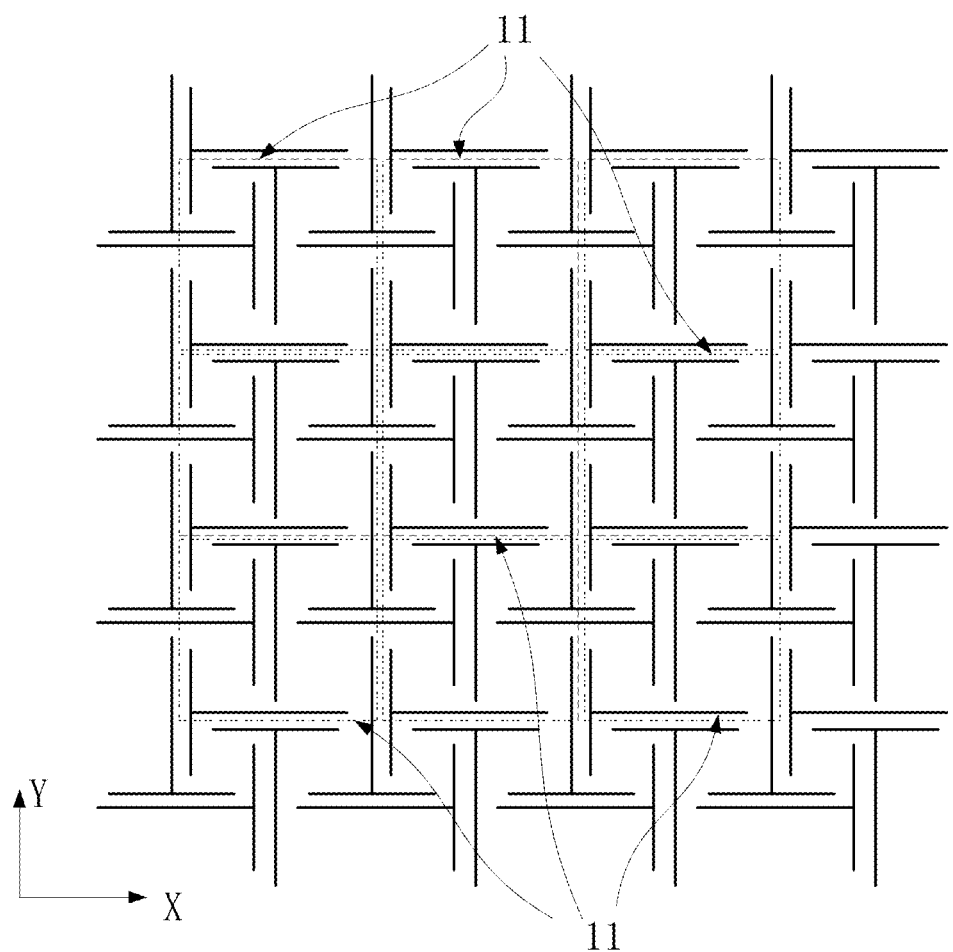
FIG. 7 is a schematic view of dividing the display substrate into a plurality of stretchable display areas according to an embodiment of the present disclosure.
Figure 8:
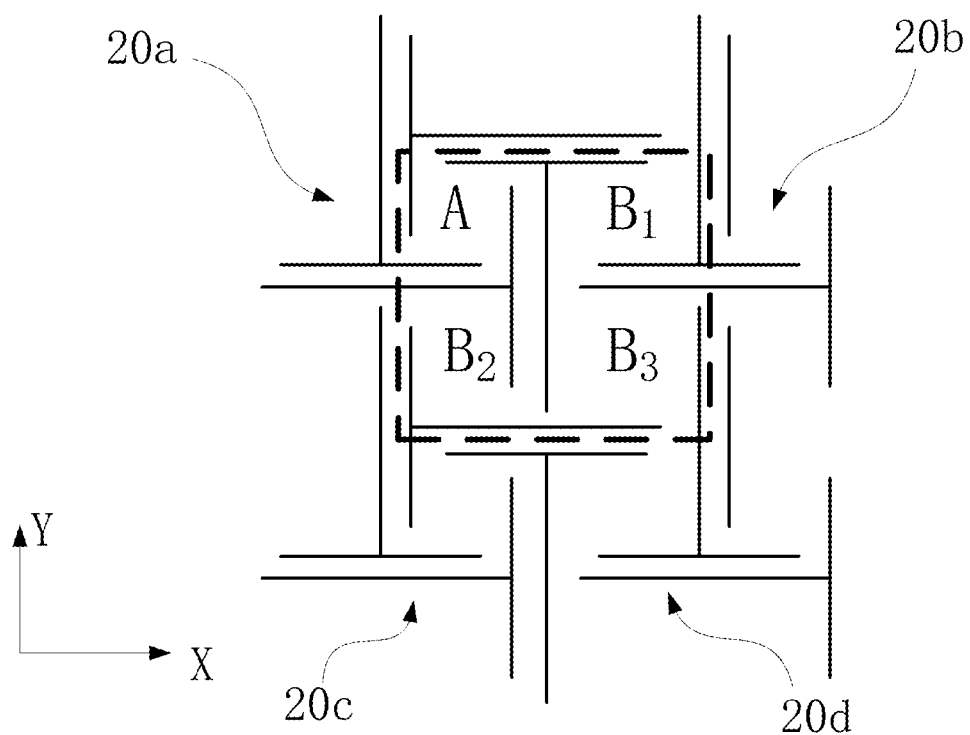
FIG. 8 is a schematic view of the constitution of a stretchable display area in FIG. 7.

FIG. 7 is a schematic view of dividing the display substrate into a plurality of stretchable display areas according to an embodiment of the present disclosure. FIG. 8 is a schematic view of the constitution of a stretchable display area in FIG. 7.

Referring to FIGS. 7 and 8, In some embodiments, the stretchable base 10 includes a plurality of stretchable display areas 11 formed by the plurality of opening patterns and sequentially distributed along the first direction X and the second direction Y. Each stretchable display area 11 includes a first island area A and three second island areas.

For each stretchable display area 11, each first island area A may be enclosed by a plurality of bridge areas in the first opening patterns 20a among the plurality of opening patterns. According to the first direction X and the second direction Y shown in FIG. 8, the first opening pattern 20a here may be the opening pattern located at the upper left corner of FIG. 8. Correspondingly, the first opening patterns 20 corresponding to respective stretchable display areas 11 are located at the upper left corner.

The first of the three second island areas (i.e., the second island area $B_1$) is enclosed by part of bridge areas of the first opening pattern 20a and part of bridge areas of the second opening pattern 20b among the plurality of opening patterns that is adjacent to the first opening pattern 20a along the first direction X. The second of the three second island areas (i.e., the second island area $B_2$) is enclosed by part of bridge areas of the first opening pattern 20a and part of bridge areas of the third opening pattern 20c among the plurality of opening patterns that is adjacent to the first opening pattern 20a along the second direction Y. According to the first direction X and the second direction Y shown in FIG. 8, the second opening pattern 20b and the third opening pattern 20c here are the opening patterns located at the upper right corner and the lower left corner of FIG. 8 respectively.

The third of the three second island areas (i.e., the second island area $B_3$) is enclosed by part of bridge areas of the first opening pattern 20a, part of bridge areas of the second opening pattern 20b, part of bridge areas of the third opening pattern 20c and part of bridge areas of the fourth opening pattern 20d among the plurality of opening patterns that is both adjacent to the second opening pattern 20b and the third opening pattern 20c. The fourth opening pattern 20d here corresponds to being adjacent to the first opening pattern 20a in the diagonal direction. According to the first direction X and the second direction Y shown in FIG. 8, the fourth opening pattern 20d here is the opening pattern at the lower right corner of FIG. 8.

For the stretchable base, the size of the island area and the parameters of the opening pattern corresponding to each stretchable display area may be the same or different. In some embodiments, each of the plurality of stretchable display areas may have substantially equal Young's modulus. Regardless of whether the stretchable display area is located at the edge position or the center position of the stretchable base, its Young's modulus is substantially equal, so that the display substrate may be deformed uniformly in a macroscopic sense, thereby avoiding abnormal display after the display substrate is stretched.

Figure 9:
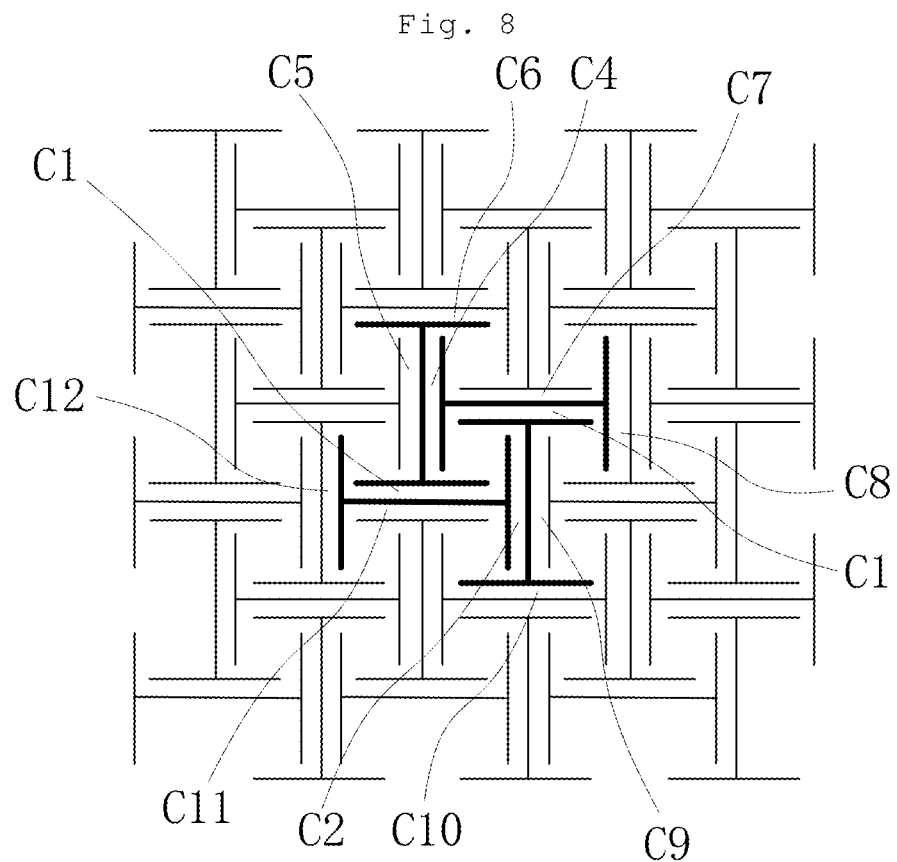
FIG. 9 is a schematic structural view of another embodiment of the display substrate according to the present disclosure.
Figure 10:
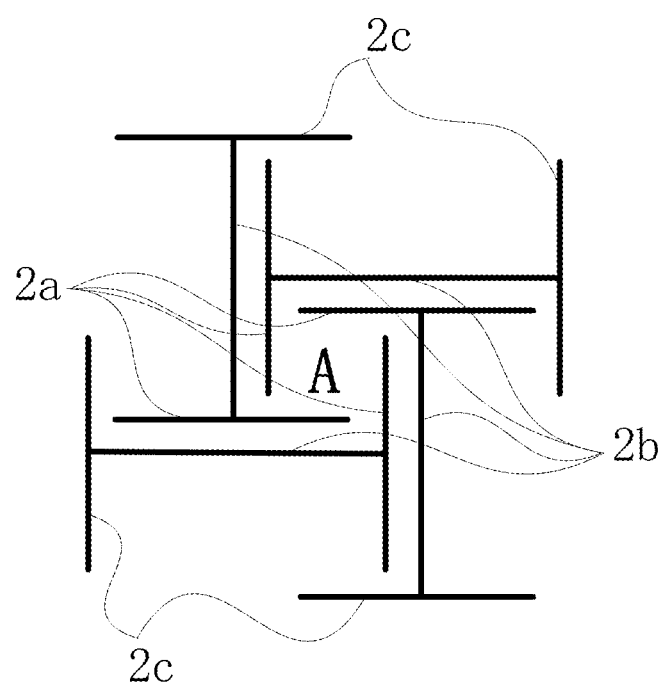
FIG. 10 is a schematic view of an example of one opening pattern in the embodiment of FIG. 9.
Figure 11:
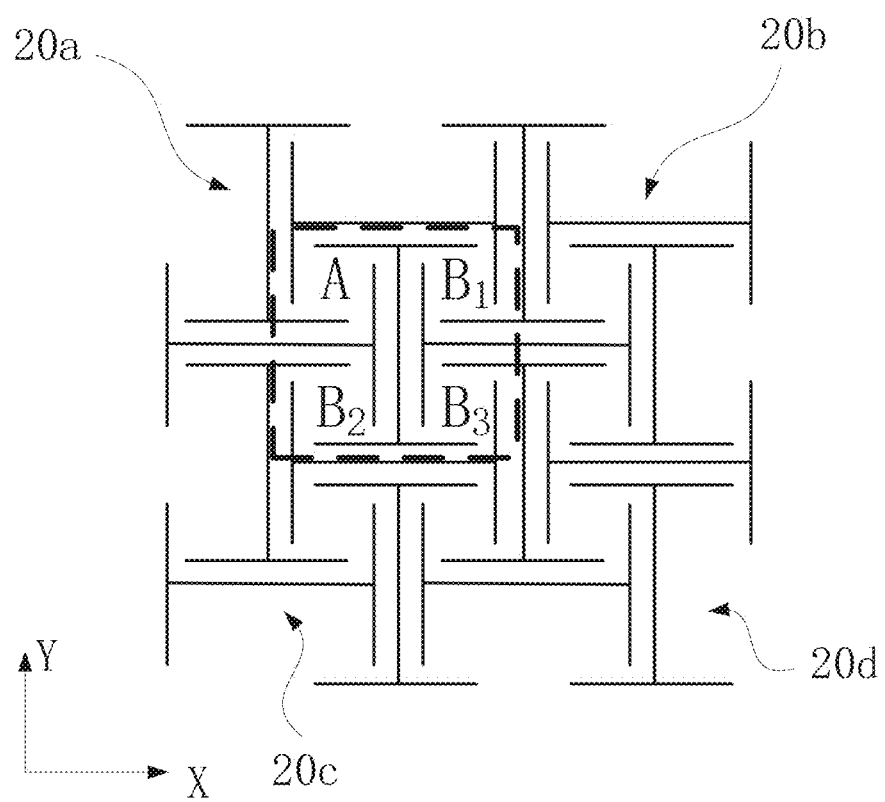
FIG. 11 is a schematic view of the constitution of one stretchable display area in FIG. 9.

FIG. 9 is a schematic structural view of another embodiment of the display substrate according to the present disclosure. FIG. 10 is a schematic view of an example of one opening pattern in the embodiment of FIG. 9. FIG. 11 is a schematic view of the constitution of one stretchable display area in FIG. 9.

Referring to FIG. 9, in some embodiments, part of the opening patterns among the plurality of opening patterns include opening areas configured to form bridge areas with opening areas in adjacent opening patterns. In FIG. 9, each opening pattern includes four I-shaped opening areas. In order to reflect the characteristics of the bridge areas between adjacent opening patterns, the opening area of one opening pattern is bolded here, while the opening areas of adjacent opening patterns are not bolded. It should be noted that the thickness of the lines in each of the accompanying drawings of the present disclosure is only intended for comparative description, without reflecting the actual hole width of the opening area.

In FIG. 10, each of the four I-shaped opening areas includes one first elongated hole section 2a, one third elongated hole section 2c that does not intersect with the first elongated hole section 2a, and one second elongated hole section 2b located between the first elongated hole section 2a and the third elongated hole section 2c, and communicating with non-end portions of the first elongated hole section 2a and the third elongated hole section 2c respectively.

The first elongated hole sections 2a of respective I-shaped opening areas are respectively located around the first island area A and sequentially rotate 90 degrees around the first island area A. The second elongated hole sections 2b of respective I-shaped opening areas are respectively located around the first island area, sequentially rotate 90 degrees around the first island area, and form a bridge area with the first elongated hole sections 2a in adjacent I-shaped opening areas in the same clockwise direction around the first island area A. The third elongated hole sections 2c of respective I-shaped opening areas form a bridge area with the opening areas in adjacent opening patterns.

In FIG. 9, the first elongated hole section 2a and the second elongated hole section 2b form bridge areas C1, C2, C3, and C4 located in four directions of the first island area A. There are a total of eight adjacent opening patterns around the opening pattern displayed in bold. Correspondingly, the third elongated hole sections 2c of respective I-shaped opening areas in the opening pattern and the opening areas of respective adjacent opening patterns form a total of eight bridge areas, i.e., bridge areas C5, C6, C7, C8, C9, C10, C11 and C12. By selecting a suitable opening pattern, the number of bridge areas between adjacent island areas may be increased, and the problem of concentrated tensile stress in the bridge area may be further improved. In addition, more bridge areas may provide more options for setting a signal line.

Referring to FIGS. 10 and 11, in some embodiments, the first elongated hole section 2a, the second elongated hole section 2b, and the third elongated hole section 2c are all straight linear hole sections, and the first elongated hole section 2a and the third elongated hole section 2c are parallel to each other, and both are perpendicular to the second elongated hole section 2b. In this way, a first island area and a second island area in a rectangular or square shape may be formed.

Referring to FIGS. 7 and 8, the stretchable base in FIG. 11 also includes a plurality of stretchable display areas, each of which includes a first island area A and three second island areas (i.e., second island area B1, B2 and B3). Taking the stretchable display area shown in FIG. 8 as an example, the first island area A thereof is square with a side length of a, while the second island areas $B_1$ and $B_2$ are both rectangular with a short side length a and a long side length of a+2b, and the second island area $B_3$ is a square with a side length of a+2b, where b is a width of the bridge area. The first island area A and the three second island areas $B_1$, $B_2$, and $B_3$ of the stretchable display area in FIG. 11 are all squares with a side length of a. Compared with the T-shaped opening area, the first island area and the second island area enclosed by the opening pattern formed by the I-shaped opening area have substantially the same size, and the deformation of each island area is more consistent when the display substrate is stretched, and there are more bridge areas, which facilitates reducing concentrated tensile stress.

According to the area calculation formula, the first island area A corresponding to the T-shaped opening area has an area of $a^2$, the second island areas $B_1$ and $B_2$ both have an area of $a*(a+2b)$, and the second island area has an area of $(a+2b)^2$. The first island area A and the three second island areas $B_1$, $B_2$, and $B_3$ of the I-shaped opening area all have an area of $a^2$. Assuming the value of a is 300 µm and the value of b is 80 µm, the island area in a stretchable display area corresponding to the I-shaped opening area has a total area of $36*10^4$ µm$^2$. The island area in a stretchable display area corresponding to the T-shaped open area has a total area of $57.76*10^4$ µm$^2$, which increases by 60.44% as compared to a total area of the island area in a stretchable display area corresponding to the I-shaped opening area. Therefore, it is possible to obtain a larger display area and increase the pixel density. In addition, although there is an area difference between the first island area and the second island area in a stretchable display area corresponding to the T-shaped opening area in a microscopic sense, based on the uniform distribution of the opening patterns, starting from the entire display substrate, the uniformity in a macroscopic sensor is still presented.

Figure 12A:
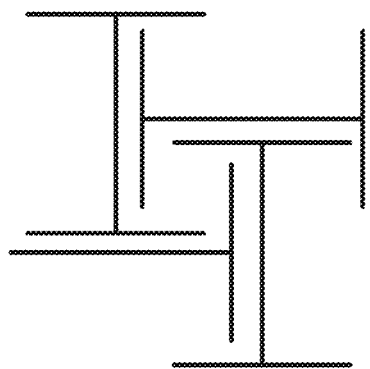
FIGS. 12 (a)-(c) are schematic views of different types of opening patterns in some embodiments of the display substrate of the present disclosure respectively.
Figure 12B:
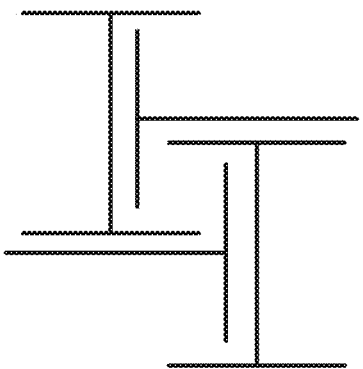
Figure 12C:
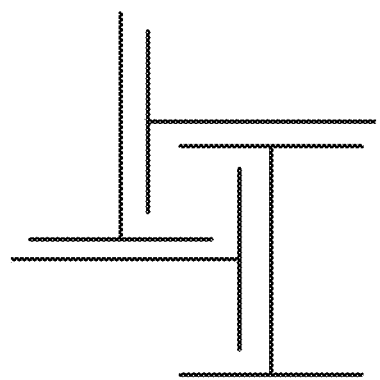

FIGS. 12 (a)-(c) are schematic views of different types of opening patterns in some embodiments of the display substrate of the present disclosure respectively.

Referring to FIGS. 2, 10, and FIGS. 12 (a)-(c), in some embodiments, each of the plurality of opening areas may have one of a T-shape and an I-shape. In the embodiment shown in FIG. 2, each opening area in an opening pattern is T-shaped. In the embodiment shown in FIG. 10, each opening area in an opening pattern is I-shaped. In the embodiments shown in (a)-(c) of FIG. 12, the four opening areas in an opening pattern may include one opening area in a T-shape and three opening areas in an I-shape, two opening areas in a T-shape and two opening areas in an I-shape, or three opening areas in a T-shape and one opening area in an I-shape. For the display substrate, it may include any one or more opening patterns in FIG. 2, FIG. 10, and FIGS. 12 (a)-(c).

By testing the solutions of achieving the stretchability of the display device by boring in the related art and the embodiments of the display substrate in the present disclosure, compared with the technical solutions in the related art, the embodiments of the display substrate in the present disclosure have a small island-to-bridge width ratio (island area width/bridge area width) and a maximum strain of the bridge area. In terms of indicators for a stretchability property, the theoretical PPI of the embodiments of the present disclosure may reach more than 90-110, which is more than two times the theoretical PPI (for example, 44) that can be achieved by part of technical solutions in the related art. Moreover, the embodiments of the present disclosure in which the opening pattern is constituted by the T-shaped opening area may further improve the theoretical PPI. The maximum stretching amount of the embodiments of the present disclosure may reach 8% to 10%, while some technical solutions in the related art may only reach 3% to 5%, which is also considerably smaller than the maximum stretching amount of the embodiments of the present disclosure. By way of the above-described comparison, compared with the technical solutions in the related art, the embodiments of the present disclosure not only increase the maximum stretching amount, but also further increase the display area and improve the PPI.

Figure 13:
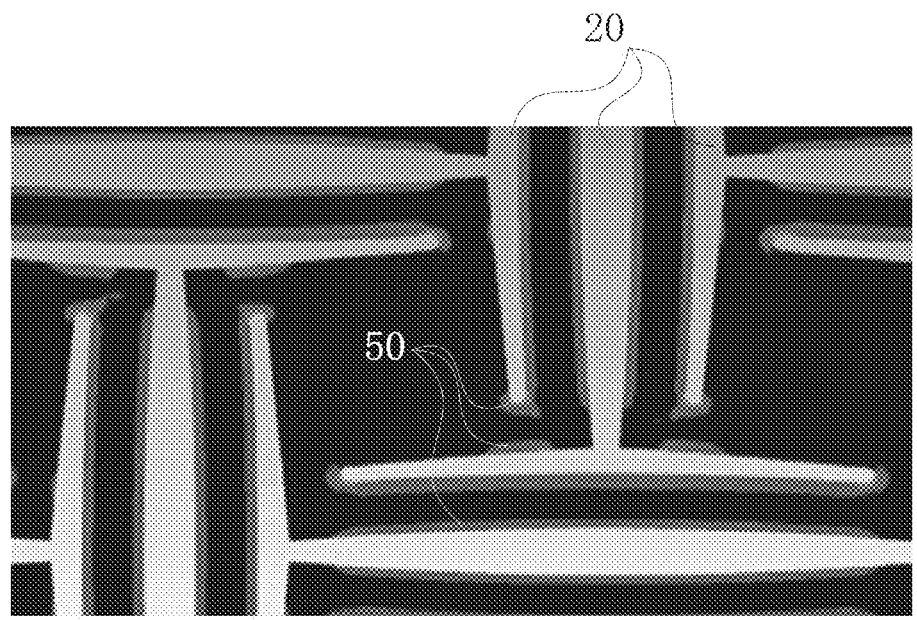
FIG. 13 is a schematic view of simulated stretching of an embodiment of the display substrate of the present disclosure.
Figure 14:
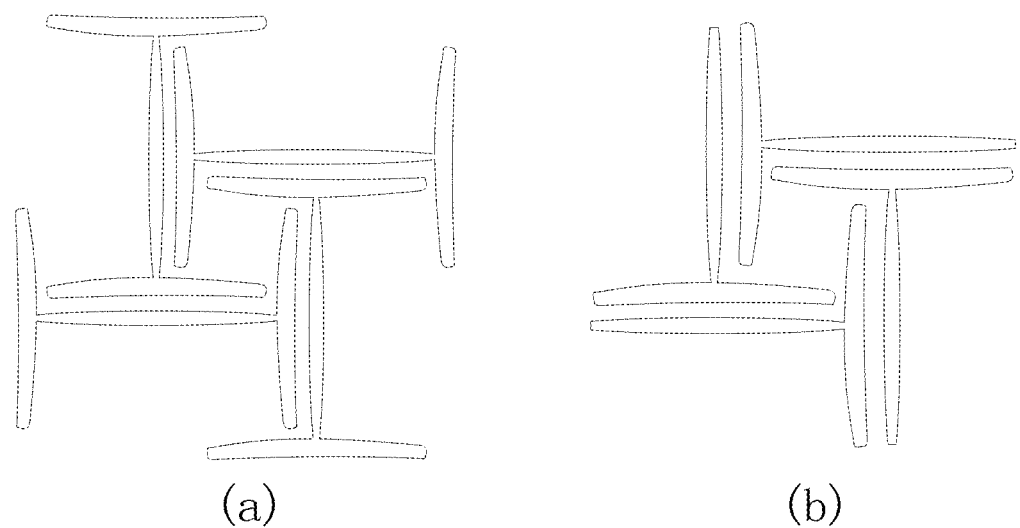
FIGS. 14 (a)-(b) are respectively schematic views of opening patterns of some embodiments of the display substrate of the present disclosure respectively.
Figure 15:
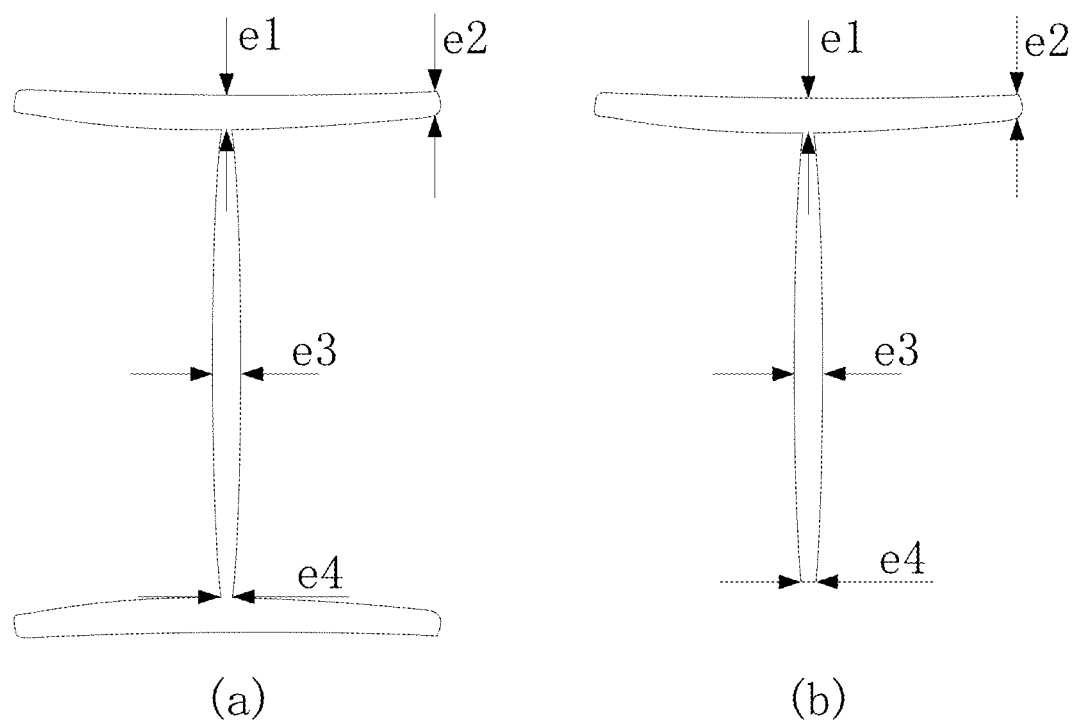
FIGS. 15 (a)-(b) are schematic views of the structure and size of one opening area in the opening patterns of FIGS. 14 (a) and (b) respectively.

FIG. 13 is a schematic view of simulated stretching of an embodiment of the display substrate of the present disclosure. FIGS. 14 (a)-(b) are respectively schematic views of opening patterns of some embodiments of the display substrate of the present disclosure respectively. FIGS. 15 (a)-(b) are schematic views of the structure and size of one opening area in the opening patterns of FIGS. 14 (a) and (b) respectively.

Referring to FIG. 13, taking a display substrate including an opening pattern 20 constituted by an I-shaped opening area as an example, the first elongated hole section, the second elongated hole section, and the third elongated hole section of the I-shaped opening area are all drum-shaped hole section. When the display substrate is in a stretched simulation, the I-shaped opening areas are all deformed to a certain extent. Referring to the stress distribution in FIG. 13, the lighter-colored area 50 at the edge of the opening area reflects a circumstance of relatively concentrated stress.

It may be seen from FIG. 13 that corresponding to a location where the stress is relatively concentrated, the middles of the first elongated hole section, the second elongated hole section, and the third elongated hole section become wider than both ends. The first elongated hole section and the third elongated hole section are all inwardly recessed into the second elongated hole section connected to themselves to form an arc shape, and the second elongated hole section is drawn into a drum shape.

In order to further increase the stretching amount of the display substrate, the shape and size of the opening pattern may be designed with reference to the simulated stretching pattern of the opening pattern of the linear hole section. Referring to FIG. 14 (a) and FIG. 15 (a), in some embodiments, the first elongated hole section and the third elongated hole section respectively connected to both ends of the second elongated hole section are both arc-shaped hole sections (that is, the center line of the hole section is an arc).

The width e1 of the middle portion of the arc-shaped hole section is 1.5 to 2 times the widths e2 of both ends respectively. The center of the arc-shaped hole section is located on one side away from the second elongated hole section. In actual design, the hole wall on one side adjacent to the second elongated hole section may be provided in an arc shape, and the hole wall on one side away from the second elongated hole section may be provided in a straight linear shape.

The second elongated hole section is a drum-shaped hole section, and the width e3 of the middle portion of the drum-shaped hole section is respectively 2 to 3 times the widths e4 of both ends. In actual design, the hole walls on both sides of the second elongated hole section may be provided in an arc shape, so that the second elongated hole section has a drum shape.

Referring to FIG. 14 (b) and FIG. 15 (b), in some embodiments, the first elongated hole section is an arc-shaped hole section (that is, the center line of the hole section is an arc). The width e1 of the middle portion of the arc-shaped hole section is 1.5 to 2 times the widths e2 of both ends, and the center of the circle is located on one side away from the second elongated hole section. In an actual design, the hole wall on one side adjacent to the second elongated hole section may be provided in an arc shape, and the hole wall on one side away from the second elongated hole section may be provided in a straight linear shape.

The second elongated hole section is a drum-shaped hole section, and the middle width e3 of the drum-shaped hole section is respectively 2 to 3 times the widths e4 of both ends. In actual design, the hole walls on both sides of the second elongated hole section may be provided in an arc shape, so that the second elongated hole section has a drum shape.

By way of the above-described design of the shape and size of the arc hole section and the drum-shaped hole section, in some embodiments of the display substrate, it is possible to increase a maximum amount of deformation and improve the stretching stability.

The above-described embodiments of the display substrate are applicable to various display devices. Accordingly, the present disclosure also provides a display device, including any of the foregoing embodiments of the display substrate. The display device may be any product or component with a display function, such as a mobile phone, a tablet computer, a television, a monitor, a notebook computer, a digital photo frame, a navigator, and an augmented/virtual reality helmet.

Figure 16:
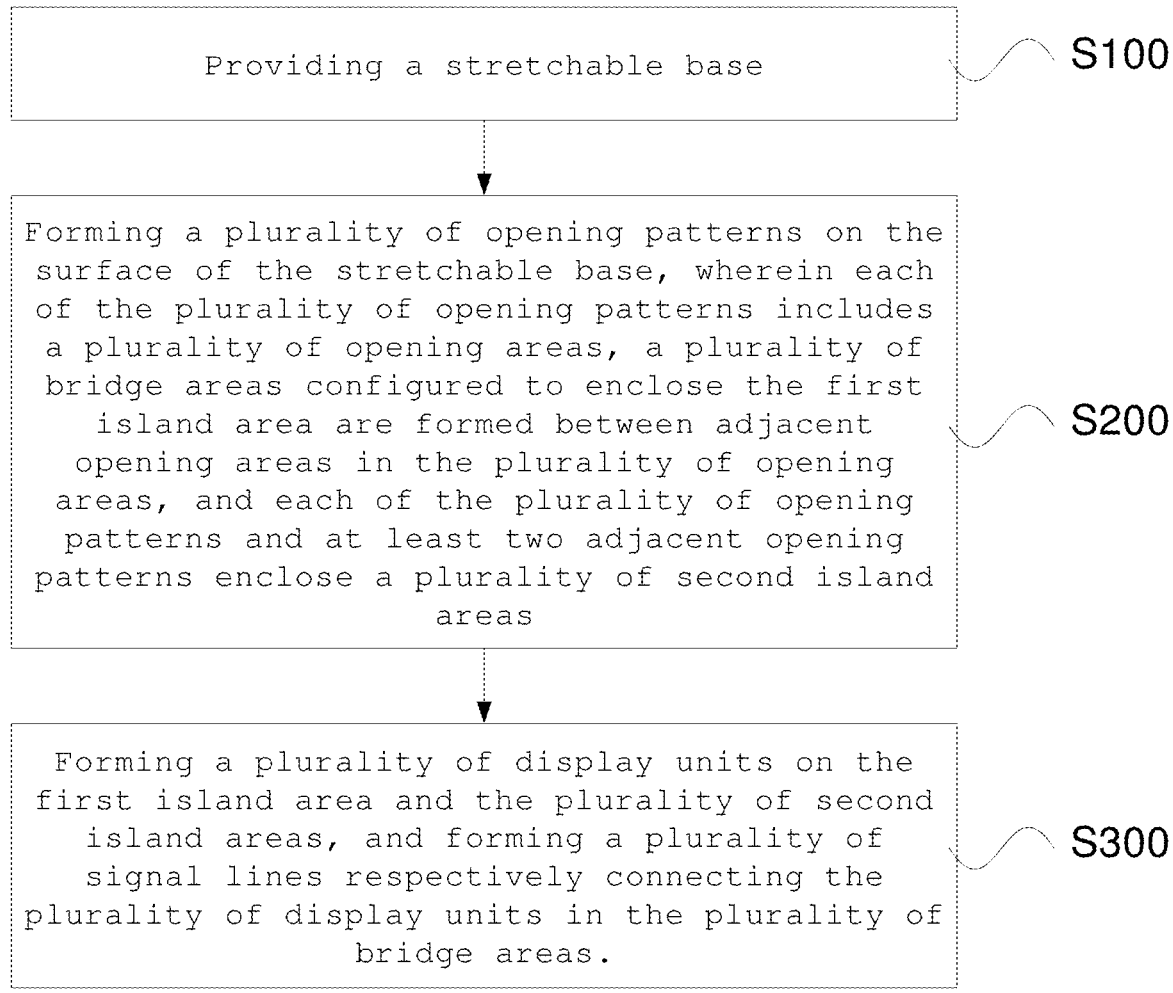
FIG. 16 is a schematic flowchart of an embodiment of the manufacturing method of the display substrate of the present disclosure.

FIG. 16 is a schematic flowchart of an embodiment of the manufacturing method of the display substrate of the present disclosure.

Referring to FIG. 16 and the foregoing embodiments of the display substrate, the present disclosure also provides a manufacturing method of the display substrate. In FIG. 16, the manufacturing method of the display substrate includes step S100 to step S300. In step S100, a stretchable base is provided. In step S200, a plurality of opening patterns are formed on the surface of the stretchable base, and each of the plurality of opening patterns includes a plurality of opening areas. A plurality of bridge areas configured to enclose the first island area are formed between adjacent opening areas among the plurality of opening areas, and each of the plurality of opening patterns and at least two adjacent opening patterns enclose a plurality of second island areas.

In step S300, a plurality of display units are formed on the first island area and the plurality of second island areas, and a plurality of signal lines respectively connecting the plurality of display units are formed in the plurality of bridge areas.

In some embodiments, the step S200 and the step S300 may be interchanged in sequence. That is, step S300 is firstly performed to form a plurality of display units at locations of the surface of the stretchable base corresponding to the first island area and the plurality of second island areas, and form a plurality of signal lines in the surface of the stretchable base corresponding to the plurality of bridge areas, and then step S200 is performed to form an opening pattern in the surface of the stretchable base.

Multiple embodiments in the present description are described in a progressive manner, with different focuses for the respective embodiments which may be subjected to cross-reference for the same or similar portions. For the embodiments of the method, since the method as a whole and the steps involved are in a relationship corresponding to the content in the embodiments of the system, such embodiments are described in a relatively simple manner. The partial descriptions of the embodiments of the system may be referred thereto for the relevant aspects.

Hereto, various embodiments of the present disclosure have been described in detail. Some details well known in the art are not described to avoid obscuring the concept of the present disclosure. According to the above description, those skilled in the art would fully know how to implement the technical solutions disclosed herein. Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display substrate comprising:
a stretchable base comprising a plurality of opening patterns distributed along a surface of the stretchable base, wherein each of the plurality of opening patterns comprises a plurality of opening areas, a plurality of bridge areas configured to enclose a first island area are formed between adjacent opening areas among the plurality of opening areas, and each of the plurality of opening patterns is configured to enclose a plurality of second island areas with at least two adjacent opening patterns;
a plurality of display units respectively arranged on the first island area and the plurality of second island areas; and
a plurality of signal lines respectively arranged in the plurality of bridge areas, configured to connect the plurality of display units.

2. The display substrate according to claim 1, wherein each of at least two among the plurality of opening areas comprises elongated hole sections, and an elongated bridge area is formed between elongated hole sections of adjacent opening areas.

3. The display substrate according to claim 2, wherein the elongated hole sections of adjacent opening areas are parallel to each other.

4. The display substrate according to claim 2, wherein the elongated bridge areas located on both opposite sides of the first island area are parallel to each other.

5. The display substrate according to claim 2, wherein the elongated bridge areas located on both adjacent sides of the first island area are perpendicular to each other.

6. The display substrate according to claim 1, wherein the plurality of opening patterns are sequentially arranged along a first direction and a second direction orthogonal to each other, part of bridge areas in two adjacent opening patterns along the first direction among the plurality of opening patterns are staggered with each other, and partially overlap in orthographic projections on a first reference line extending along the first direction, and part of bridge areas in two adjacent opening patterns along the second direction among the plurality of opening patterns are staggered with each other, and partially overlap in orthographic projections on a second reference line extending along the second direction.

7. The display substrate according to claim 6, wherein the stretchable base comprises a plurality of stretchable display areas formed by the plurality of opening patterns and sequentially distributed along the first direction and the second direction, and each stretchable display area comprises the first island area and three second island areas, wherein:
the first island area is surrounded by a plurality of bridge areas in a first opening pattern among the plurality of opening patterns;
the first of the three second island areas is enclosed by part of bridge areas of the first opening pattern and part of bridge areas of the second opening pattern among the plurality of opening patterns that is adjacent to the first opening pattern along the first direction;
the second of the three second island areas is enclosed by part of bridge areas of the first opening pattern and part of bridge areas of the third opening pattern among the plurality of opening patterns that is adjacent to the first opening pattern along the second direction;
the third of the three second island areas is enclosed by part of bridge areas of the first opening pattern, part of bridge areas of the second opening pattern, part of bridge areas of the third opening pattern and part of bridge areas of the fourth opening pattern among the plurality of opening patterns that is both adjacent to the second opening pattern and the third opening pattern.

8. The display substrate according to claim 7, wherein each of the plurality of stretchable display areas has substantially equal Young's modulus.

9. The display substrate according to claim 1, wherein part of opening patterns among the plurality of opening patterns comprise an opening area configured to form a bridge area with an opening area in an adjacent opening pattern.

10. The display substrate according to claim 1, wherein each of the plurality of opening areas presents one of a T-shape and an I-shape.

11. The display substrate according to claim 10, wherein the plurality of opening areas comprise:
four T-shaped opening areas, each of which comprises one first elongated hole section and one second elongated hole section communicating with a non-end portion of the first elongated hole section, and
wherein first elongated hole sections of respective T-shaped opening areas are respectively located around the first island area and sequentially rotate 90 degrees around the first island area, and second elongated hole sections of respective T-shaped opening area are respectively located around the first island area, rotate 90 degrees around the first island area, and form a bridge area with the first elongated hole sections in adjacent T-shaped opening areas in a same clockwise direction around the first island area.

12. The display substrate according to claim 11, wherein the first elongated hole section and the second elongated hole section are both straight linear hole sections, and the first elongated hole section and the second elongated hole section are perpendicular to each other.

13. The display substrate according to claim 12, wherein the first island area has a square shape with a side length of 250-350 μm, the bridge area has a width of 60-100 μm, the second elongated hole section has a length of 800-900 μm, the first elongated hole section has a length of 500-600 μm, the first elongated hole section and the second elongated hole section both have a width of 15-25 μm, and the shortest distance between first elongated hole sections of adjacent T-shaped opening areas in the same clockwise direction around the first island area is 60-100 μm.

14. The display substrate according to claim 11, wherein the first elongated hole section is an arc-shaped hole section, a width of a middle portion of the arc-shaped hole section is 1.5 to 2 times widths of both ends of the arc-shaped hole section respectively, and a circle center of the arc-shaped hole section is located on one side away from the second elongated hole section; the second elongated hole section is a drum-shaped hole section, and a width of the middle of the drum-shaped hole section is 2 to 3 times widths of both ends of the drum-shaped hole section respectively.

15. The display substrate according to claim 10, wherein the plurality of opening areas comprise:
four I-shaped opening areas, wherein each of the four I-shaped opening areas comprises one first elongated hole section, one third elongated hole section that does not intersect with the first elongated hole section, and one second elongated hole section located between the first elongated hole section and the third elongated hole section, and communicating with non-end portions of the first elongated hole section and the third elongated hole section respectively, and
wherein first elongated hole sections of respective I-shaped opening areas are respectively located around the first island area and sequentially rotate 90 degrees around the first island area; second elongated hole sections of respective I-shaped opening areas are respectively located around the first island area, sequentially rotate 90 degrees around the first island area, and form a bridge area with the first elongated hole sections in adjacent I-shaped opening areas in a same clockwise direction around the first island area; and the third elongated hole sections of respective I-shaped opening areas form bridge areas with opening areas in adjacent opening patterns.

16. The display substrate according to claim 15, wherein the first elongated hole section, the second elongated hole section and the third elongated hole section are all straight linear hole sections, and the first elongated hole section and the third elongated hole section are parallel to each other, and are both perpendicular to the second elongated hole section.

17. The display substrate according to claim 15, wherein the first elongated hole section and the third elongated hole section are both arc-shaped hole sections, and a width of a middle portion of the arc-shaped hole section is 1.5~2 times widths of both ends of the arc-shaped hole section respectively, and a circle center of the arc-shaped hole section is located on one side away from the second elongated hole section; the second elongated hole section is a drum-shaped hole section, and a widths of a middle portion of the drum-shaped hole section is 2~3 times widths of both ends of the drum-shaped hole section respectively.

18. The display substrate according to claim 1, wherein each of the plurality of display units comprises an organic light emitting diode or a quantum dot light emitting diode.

19. A display device comprising the display substrate according to claim 1.

20. A manufacturing method of a display substrate comprising the steps of:
providing a stretchable base;
forming a plurality of opening patterns in a surface of the stretchable base, wherein each of the plurality of opening patterns comprises a plurality of opening areas, a plurality of bridge areas configured to enclose a first island area are formed between adjacent opening areas among the plurality of opening areas, and each of the plurality of opening patterns is configured to enclose a plurality of second island areas with at least two adjacent opening patterns;
forming a plurality of display units on the first island area and the plurality of second island areas, and forming a plurality of signal lines respectively connected to the plurality of display units in the plurality of bridge areas.

* * * * *

UNITED STATES PATENT AND TRADEMARK OFFICE
CERTIFICATE OF CORRECTION

PATENT NO. : 11,871,645 B2
APPLICATION NO. : 17/255293
DATED : January 9, 2024
INVENTOR(S) : Shengguang Ban et al.

It is certified that error appears in the above-identified patent and that said Letters Patent is hereby corrected as shown below:

In the Specification

Column 1, Line 10, delete "PCT/CN2019/092239," and insert -- PCT/CN2020/092239, --

Signed and Sealed this
Sixteenth Day of July, 2024

Katherine Kelly Vidal
Director of the United States Patent and Trademark Office